Feb. 16, 1971 M. O. EIDE 3,564,441

LOW-PASS ACTIVE FILTER

Filed March 4, 1968

INVENTOR.
MELVIN O. EIDE
BY
ATTORNEY

United States Patent Office 3,564,441
Patented Feb. 16, 1971

3,564,441
LOW-PASS ACTIVE FILTER

Melvin O. Eide, Seattle, Wash., assignor to United Control Corporation, Redmond, Wash., a corporation of Delaware Filed Mar. 4, 1968, Ser. No. 710,218
Int. Cl. H03f 3/04
U.S. Cl. 330—31 6 Claims

ABSTRACT OF THE DISCLOSURE

A low-pass filter employs an active filter preceded by a passive filter, the active filter being AC coupled in shunt with the passive filter. The passive filter carries most of the current, thus reducing the current supplied to the active filter and permitting the components of the active filter to be of smaller size.

BACKGROUND OF THE INVENTION

Field of the invention

This invention relates in general to filter networks, and relates more particularly to such networks for generating third order and higher derivative functions.

Description of the prior art

It is well-known in many applications to use third order and higher derivative networks for a variety of purposes to obtain the benefit of the steep filtering characteristic which such networks can provide. Many such third order networks are constructed employing combinations of inductors and capacitors to provide the desired transfer function. However, since it is difficult to accurately build very small inductors, on the same scale of size as is now achievable with printed circuit techniques for resistors and capacitors, there are many situations, such as in the aircraft and space industries, where the weight and size of the required inductors make their use unattractive.

One approach to this problem which avoids the use of inductors is to employ RC networks in conjunction with operational amplifiers to achieve the desired transfer function. Examples of this approach are set forth in an article entitled "Simulation of Third Order Systems by a Single Operational Amplifier" by L. K. Wadha, appearing in the April 1964 issue of the IEEE Transactions on Electronic Computers. However, such networks have the disadvantage that they require the use of amplifiers to produce third order and higher derivative functions, thereby increasing the cost and size of the resultant circuits. Additionally, such circuits employing active elements may produce undesirable effects on the DC accuracy of the input signals because of drift or offset introduced by the active elements.

It has also been proposed to produce a third order characteristic by a circuit employing only one operational amplifier and an RC feedback network for the amplifier. This circuit does require only the one amplifier, but it has the disadvantages of requiring high output currents from the amplifier to charge the capacitors in the feedback network and of having stability problems because of the complex feedback network.

Further, an example of circuitry employing a single operational amplifier and RC circuits for producing a second order characteristic is shown in U.S. Pat. 3,122,714, Morris. However, this circuitry is not capable of providing a third order characteristic, and must be cascaded to provide a fourth order characteristic.

SUMMARY OF THE INVENTION

In accordance with the present invention, there is provided a low-pass active filter employing a passive filter portion ahead of an active filter portion which is AC coupled in shunt thereto. Under these circumstances, most of the current is bypassed through the passive portion, reducing the load current of the active portion. This permits the capacitive elements of the active filter to be of reduced size, thus reducing their physical size and cost and reducing the amplifier output current required to charge them. This, in turn, permits a reduction in the size of the amplifier in the active filter to thereby reduce its cost. The feedback path for the amplifier in the active filter portion includes only a single resistor, thus reducing the probability of stability problems in the feedback network. Further, the filter network of this invention is stable with temperature, and the open loop characteristic of the amplifier is not a factor in the filter operation.

The use of this AC coupling of the active portion of the filter prevents any drift or offset which may be present in the active circuitry from affecting either the input or output signal of the filter. This prevents any deterioration in the DC accuracy of the input signal to the filter and eliminates a problem which is a significant disadvantage in prior art filters employing active circuitry and provides for an adjustable damping ratio.

The filter network of this invention lends itselft to a wide range of desired characteristics by simple predictable adjustments. Thus, by suitable design, the network may produce a number of different filter characteristics, such as Butterworth or Tschebyscheff.

It is therefore an object of the present invention to provide an improved low-pass filter network employing passive and active filter elements.

It is a further object of this invention to provide a low-pass filter network employing an AC coupled active portion preceded by a passive portion, with no DC drift or offset.

It is an additional object of the present invention to provide an improved filter network having a third order or higher response with an adjustable damping ratio.

It is a further object of this invention to provide a low-pass filter network employing an active filter portion preceded by a passive filter portion, the active filter portion being AC coupled in shunt with the passive filter portion.

It is a further object of this invention to provide a low-pass filter network employing an active filter portion preceded by a passive filter portion, the passive filter portion bypassing a large portion of the current to thereby reduce the loading of the active filter portion.

It is an additional object of the present invention to provide a low-pass filter network which is inexpensive, small in size and weight, stable with temperature, and which has a small power dissipation.

Objects and advantages other than those set forth above will be apparent from the following description when read in connection with the accompanying drawing, in which:

DESCRIPTION OF THE PREFERRED EMBODIMENT

Figure 1:
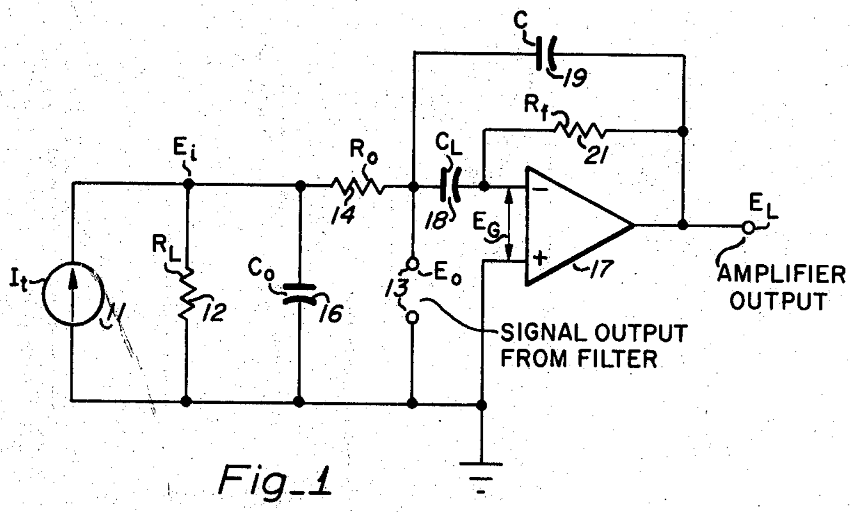
FIG. 1 is a circuit diagram of a filter network in accordance with this invention for producing a third order derivative characteristic.

Referring to FIG. 1, a third order filter network is illustrated receiving an input from a current source 11.

Current source 11 may be of any suitable type, such as the torque coil or offset current generator of an accelerometer. Alternatively, the input may be supplied from a voltage source with a series resistance, as is well-known in the art. An input voltage, $E_i$, is developed across a load resistor $R_L$, identified by reference character 12. The filter network output voltage is $E_o$, and appears across a pair of terminals 13, one of which is connected to the common point of the circuit. A series isolating resistor $R_o$ identified by reference character 14, is connected between load resistor 12 and the upper output terminal 13. A capacitor $C_o$, identified by reference character 16, acts as a frequency dependent current shunt around load resistor 12.

Following the above-described passive filter portion, and AC coupled thereto in shunt, is the active filter portion of the network. This portion includes a differential amplifier 17 which may be of any conventional type. A capacitor $C_L$, identified by reference character 18, is connected between one output terminal 13 and one input terminal of amplifier 17. A capacitor C, identified by reference character 19, is connected across the one output terminal 13 and the output terminal of amplifier 17. A feedback resistor $R_f$, identified by reference character 21, is connected between the negative input terminal of amplifier 17 and its output terminal.

This active portion of the network, comprising amplifier 17, capacitors 18, 19 and resistor 21, acts as a frequency dependent active current shunt across the output terminals 13.

The operation of the network of FIG. 1 to generate third order derivative signals can best be understood from the following theoretical considerations.

If the capacitor 16 is omitted from the circuit of FIG. 1, the resulting circuit is a well-known shunt type second order active filter, whose transfer function is of the form:

$$\frac{E_o}{I_t}=\frac{R_L}{\frac{S^2}{\omega_n^2}+\frac{2\delta}{\omega_n}S+1}$$

where $\delta$ is the system damping ratio, $\omega_n$ is the system natural frequency $S=J\omega$, where $\omega$ is the angular frequency of input source $I_t$ and $j=\sqrt{-1}$.

The transfer function is an impedance whose value is $R_L$ for $\omega << \omega_n$, and which becomes complex when $V \approx \omega_n$, approaching zero at a 12 db/octave slope for $\omega >> \omega_n$.

When capacitor 16 is added to the circuit, the transfer function becomes third order and is of the form:

$$\frac{E_o}{I_t}=\frac{R_L}{\left(\frac{S^2}{\omega_n^2}+\frac{2\delta}{\omega_n}S+1\right)\left(\frac{S}{\omega_o}+1\right)}$$

where $\omega_o$ is the additional angular break frequency.

The behavior of this transfer function is similar to the second order case, with the exception that the impedance approaches zero at an 18 db/octave slope for $\omega >$ both $\omega_n$ and $\omega_o$.

If $R_o >> R_L$, the third break frequency is simple, and may be expressed as:

$$\omega_o=\frac{1}{R_LC_o}$$

However, in the practical case, the resistances $R_L$ and $R_o$ are the same order of magnitude, and as such the parameters $\omega_o$, $\omega_n$ and $\delta$ are not simple functions of the circuit R and C values. Hence the circuit equations may be developed as follows from a consideration of FIG. 1;

$$It=\frac{E_i}{R_L}+E_iC_oS+\frac{E_i-E_o}{R_o} \quad (1)$$

$$\frac{E_i-E_o}{R_o}=(E_o-E_g)C_LS+(E_o-E_L)CS \quad (2)$$

$$(E_o-E_g)C_LS=\frac{E_g-E_L}{R_f} \quad (3)$$

Assuming that the open loop gain $=\infty$ for amplifier 17, the following is true:

$$\left(I_T+\frac{E_o}{R_o}\right)\left(\frac{R_L}{R_o+R_L+R_oR_LC_oS}\right)=\frac{E_o}{R_o}+E_oC_LS+E_oCS+E_oR_fCC_LS^2 \quad (4)$$

Solution of this equation $E_o/I_T$, in accordance with techniques known in the art, yields the following:

$$\omega_o\omega_n^2=\frac{1}{R_oR_fR_LCC_oC_L} \quad (5)$$

$$2\delta\omega_n+\omega_o=\frac{1}{R_fC}+\frac{1}{R_fC_L}+\frac{1}{R_LC_o}+\frac{1}{R_oC_o} \quad (6)$$

$$\omega_n^2+2\delta\omega_o\omega_n=\frac{1}{R_oR_fCC_L}+\frac{1}{R_fR_LC_oC_L}+\frac{1}{R_fR_LCC_o}+\frac{1}{R_oR_fC_oC_L}+\frac{1}{R_oR_fCC} \quad (7)$$

These three equations contain 5 unknowns; however if $C=C_L$ *and* $R_o=R_L$, then:

$$\omega_o\omega_n^2=\frac{1}{R_fC_oR_L^2C^2} \quad (8)$$

$$2\delta\omega_n+\omega_o=\frac{2}{R_fC}+\frac{2}{R_LC_o} \quad (9)$$

$$\omega_n^2+2\delta\omega_o\omega_n=\frac{C_o+4C}{R_LR_fC_oC^2} \quad (10)$$

For the maximally flat case where $\delta=0.5$ and $\omega_o=\omega_n$, Equation 8 through 10 further reduce to:

$$\omega_n^3=\frac{1}{R_fR_L^2C_oC^2} \quad (11)$$

$$2\omega_n^2=\frac{C_o+4C}{R_LR_fC_oC^2} \quad (12)$$

$$\omega_n=\frac{1}{R_fC}\frac{1}{R_LC_o} \quad (13)$$

Simultaneous solution of Equations 11 through 13 yields the following:

$$C_o=\frac{1.3}{\omega_nR_L} \quad (14)$$

$$C=\frac{0.175}{\omega_nR_L} \quad (15)$$

$$R=25R_L \quad (16)$$

To determine the sizes of the element C, $C_o$ and $R_F$ in a practical embodiment, assume that:

$f_o=52$ c.p.s. $\omega_n=326$ and $R_L=2.5$K ohms. Then:
$C_o=1.6$ mfd.
$C=0.215$ mfd.
$R_f=62.5$K ohms.

From the foregoing, it will be seen that there is provided a network for generating third order functions which has many advantages over those known in the art. By virtue of the AC coupling of the active filter portion, any drift or offset present in the active circuitry will not affect either of the input signal or the output signal so that the DC accuracy of the input signal is not affected. The damping ratio of the filter network may be readily adjusted by varying the value of the feedback resistor 21, and the overall response characteristic of the filter network can be modified to produce any desired filter characteristic, such as a Butterworth or a Tschebyscheff response.

As a further advantage, it will be seen that the capacitor 16 shunts the load resistor, thus significantly limiting the sinusoidal voltage input to capacitors 18, 19 and amplifier 17, as a function of frequency. This also reduces the peak currents required to charge capacitors 18 and 19. Additionally, the filter can be synthesized such that capacitors 18 and 19 are only about 10% to 20% of their normal values, with a proportionate increase in the size of resistor 21. As an example, capacitors 18 and 19 can be made only a tenth the size of capacitor 16, thus significantly reducing the amplifier output current required to charge capacitor 19. This, in turn, permits the power output required of amplifier 17 to be reduced, thus reducing its cost as well as decreasing the size of capacitors 18 and 19. As a further advantage, since the amplifier feedback network consists of only resistor 21, the stability problems in this feedback network are reduced.

The network of this invention also has the advantages of being small in physical size and weight, low in power dissipation, inexpensive to produce, and stable with temperature over a wide range.

Figure 2:
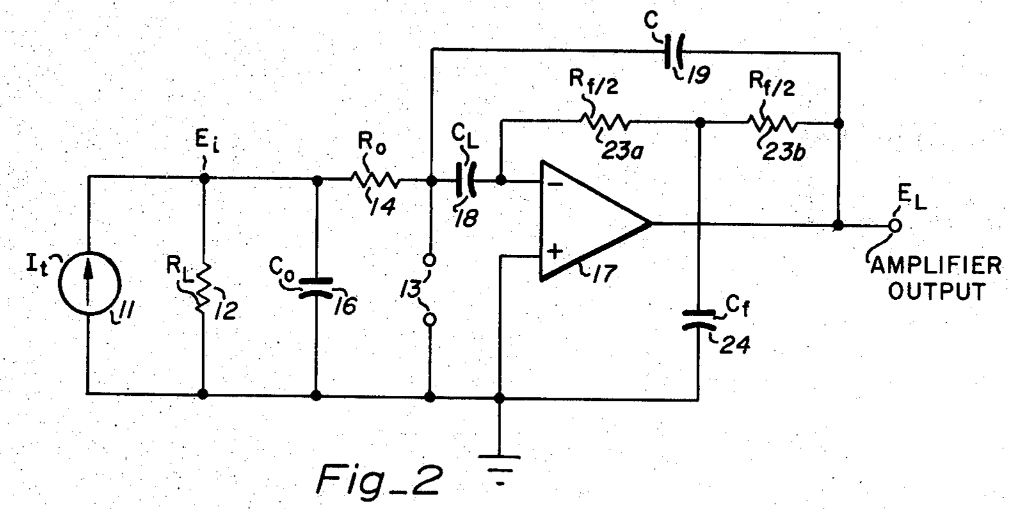
FIG. 2 is a circuit diagram of an alternate embodiment of the invention for producing a fourth order derivative characteristic.

FIG. 2 illustrates an alternate embodiment of this invention for generating a fourth order derivative function. Current source 11 is connected as before to load resistor 12, and capacitor 16 is connected across this load resistor. Series isolating resistor 14 is connected between the passive filter portion and output terminal 13. The active filter portion, which is AC shunt coupled to the passive filter portion, comprises amplifier 17 and capacitors 18 and 19, as before. However, the active portion also includes an RC network including a capacitor $C_f$, identified by reference character 24, and a resistive element including two resistors 23*a*, 23*b*, each identified as $R_{f/2}$. Capacitor 24 is connected bewteen the junction of resistors 23*a*, 23*b* and ground.

It can be proven that the circuit of FIG. 2, without capacitor 16 therein, is operative to generate a third order function, and that the addition thereto of capacitor 16 causes the network to generate a fourth order function in a manner similar to that set forth above theoretically. The circuit of FIG. 2 will have all of the advantages set forth above for the circuit of FIG. 1, except that the presence of the RC network in the amplifier feedback network may tend to create more stability problems than will be encountered with the circuit of FIG. 1.

It will be apparent from the above that various changes and modifications may be made in the illustrated embodiment of the invention. For example, to obtain a higher order filter with optimallly flat response, two stages as shown in FIG. 1 may be employed, with one stage operating as an underdamped system, and the second stage operating as an overdamped system.

Further, it will be apparent that the damping ratio of the illustrated circuit may be varied by varying the resistance of the resistor $R_f$. To increase the damping ratio, the value of the resistance $R_f$ may be decreased, along with corresponding variations in the values of $C_o$, C and $R_L$ so as to satisfy Equations 8, 9 and 10.

While the above detailed description has shown, described and pointed out the fundamental novel features of the invention as applied to various embodiments, it will be understood that various omissions and substitutions and changes in the form and details of the device illustrated may be made by those skilled in the art, without departing from the spirit of the invention. It is the intention, therefore, to be limited only as indicated by the scope of the following claims.

What is claimed is:

1. An electronic filter means comprising:

a pair of input terminal means and a pair of output terminal means;

an active two terminal filter section AC coupled in shunt across said output terminal means; and a passive first order filter section cascaded with said active filter section between said input terminal means and said output terminal means said passive filter section including an RC network having a first capacitor means shunted across said input terminal means.

2. An electronic filter means as recited in claim 1 wherein said active filter section including a differential amplifier means having first and second input terminals and an output terminal;

resistive feedback means connected between said amplifier output terminal and said first amplifier input terminal;

said capacitor means connecting said amplifier output terminal and said first amplifier input terminal to one of said filter output terminal means; and means connecting said second amplifier input terminal to the other of said filter output terminal means.

3. An electronic filter means as recited in claim 2 wherein said second capacitor means includes at least one capacitor connected between said first amplifier input terminal and said one filter output terminal means, and at least one capacitor connected between said amplifier output terminal and said one filter output terminal means.

4. An electronic filter means as recited in claim 3 wherein said resistive feedback means includes at least two resistor means connected in series; and said filter means further includes a third capacitor means coupled between the connected together ends of said two series connected resistor means and said other filter output terminal means such that said active filter section acts as a frequency dependent shunt across said pair of filter output terminal means.

5. An electronic filter means as recited in claim 4 which is at least of the third order and in which said active filter section is at least of the second order.

6. An electronic filter means as recited in claim 5 wherein one of said filter sections is underdamped and the other of said filter sections is overdamped.

References Cited

UNITED STATES PATENTS

| | | | |
|---|---|---|---|
| 2,549,065 | 4/1951 | Dietzold | 333—80X |
| 2,788,496 | 4/1957 | Linvill | 333—80 |
| 2,933,703 | 4/1960 | Ginariwala | 333—80 |
| 3,051,920 | 8/1962 | Sandberg | 333—80X |
| 3,303,354 | 2/1967 | Carroll | 333—70X |

OTHER REFERENCES

Salen & Key: "A Practical Method Of Designing RC Active Filters," IRE Transactions—Circuit Theory, pp. 74–83, March 1955.

ROY LAKE, Primary Examiner

L. J. DAHL, Assistant Examiner

U.S. Cl. X.R.

330—21, 109